United States Patent [19]

Lang

[11] Patent Number: 5,257,380
[45] Date of Patent: Oct. 26, 1993

[54] INITIALIZATION ROUTINE IN AN EEPROM

[75] Inventor: Georg Lang, Sulzbach-Rosenberg, Fed. Rep. of Germany

[73] Assignee: Siemens Aktiengesellschaft, Munich, Fed. Rep. of Germany

[21] Appl. No.: 836,138

[22] Filed: Feb. 14, 1992

[30] Foreign Application Priority Data

Feb. 25, 1991 [EP] European Pat. Off. ............ 91102757

[51] Int. Cl.$^5$ ................................................ G06F 9/22
[52] U.S. Cl. .............................. 395/700; 364/DIG. 2; 364/965.76
[58] Field of Search ............... 364/DIG. 1, DIG. 2; 395/425, 700

[56] References Cited

U.S. PATENT DOCUMENTS 4,430,704  2/1984  Page et al. ................. 364/DIG. 1

FOREIGN PATENT DOCUMENTS 3815071  11/1989  Fed. Rep. of Germany .

OTHER PUBLICATIONS

Markowitz, "Nonvolatile Memories", Sep. 1989, Elektrotechnik, No. 6, pp. 95–104.
Grossman, "Revolutionary Advances in EEPROM Features", Electro, May, 1984, pp. 1–5.
Soja, "Single Chip MCU EEPROM Programming Using Bootstrap Techniques", Electronic Engineering, Oct. 1988, pp. 75–80.
Intel Advance Information, "1024k (128k×8) CMOS Flash Memory", No. 290010-010, 1988, pp. 1–24.

Primary Examiner—Thomas M. Heckler
Attorney, Agent, or Firm—Kenyon & Kenyon

[57] ABSTRACT

A read-only memory with electrical overwrite capability has several storage cells, whereby each storage cell has one address, on the basis of which the storage cell can be individually written and read. The memory could be a read-only memory which can be quickly and completely erased. The memory has contacts for connecting lines for address signals, data signals and control signals. The read-only memory has at least two storage areas that are capable of being separately written and read, possibly also separately erased, to which the storage cells are assigned, whereby the storage cells in those areas have identical addresses. In dependence upon one internal state variable, the storage cells of one of the storage areas can only be accessed for reading purposes.

10 Claims, 3 Drawing Sheets

INITIALIZATION ROUTINE IN AN EEPROM

BACKGROUND OF THE INVENTION

The present invention relates to a read-only memory (ROM) with electrical overwrite capability and more particularly to a ROM which may have the ability to be completely erased quickly and has several storage cells, each with their own address, and furthermore has two storage areas, capable of being separately written and read, to which the storage cells are assigned, as well as to a process for changing the initialization routine stored this type of memory.

Read-only memories having electrical overwrite capabilities are known from Electronic Engineering, vol. 60, no. 742, pp. 75 - 79. The initialization routine of a computer may be stored in such a ROM. However, changing the initialization routine in such a memory can be a complex operation.

SUMMARY OF THE INVENTION

The present invention makes it possible to renew or update the initialization routine quickly, simply, inexpensively and reliably. In particular, the update procedure should be so simple and reliable that it could also be performed by the user.

The present invention achieves these advantages by providing that the storage cells have identical addresses whereby the storage cells of one of the storage areas can only be accessed for reading purposes in accordance with an internal state variable.

With this configuration the initialization routine can be altered by applying a special control signal to the ROM with the control signal enabling the overwriting of the contents of the ROM; if necessary, applying a second control signal to the ROM that enables the storage area in which the initialization routine is stored to be erased; applying address signals and data signals to overwrite the contents of the storage cells selected by the address signals; and after overwriting the contents of the ROM the special control signal is reset.

When the initialization routine and the operating system are stored in the same read-only memory, the read-only memory advantageously has at least one other storage area that is capable of being separately written and read, possibly also separately erased, so that in case of a change in the operating system, which occurs considerably more often than a change in the initialization routine, the latter cannot be inadvertently overwritten.

BRIEF DESCRIPTION OF THE DRAWINGS

Further advantages and details are revealed in the following description of an embodiment of the present invention with references to drawing figures.

DETAILED DESCRIPTION

Figure 1:
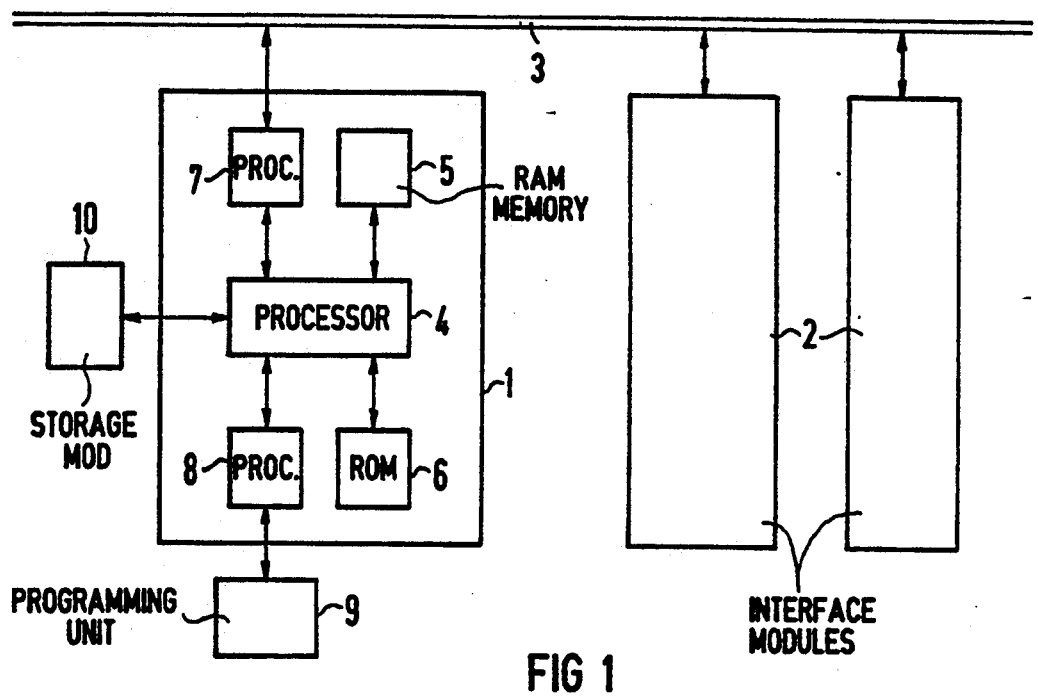
FIG. 1 illustrates a block diagram of a programmable controller in which an embodiment of the present invention may be employed.

According to FIG. 1, a modular programmable controller includes at least one central processing unit 1, as well as several interface modules 2, which are interconnected via a bus 3. The central processing unit 1 has a processor 4, a read-write memory 5 for the program to be executed, as well as a read-only memory 6 for the initialization routine and the operating system of the programmable controller. In addition, the central processing unit 1 is provided with two processors 7, 8, which are responsible for the data communication with the interface modules 2 or the programming unit 9. A storage module 10, in which an application program can be stored, for example, can also be connected to the central processing unit 1.

The read-only memory 6 is designed as a read-only memory with electrical overwrite capability, which can be quickly completely erased by means of an electric pulse. The processor 4 is, for example, a 68000 processor produced by Motorola. After a RESET command, this processor first accesses the address $0000_{16}$.

Figure 2:
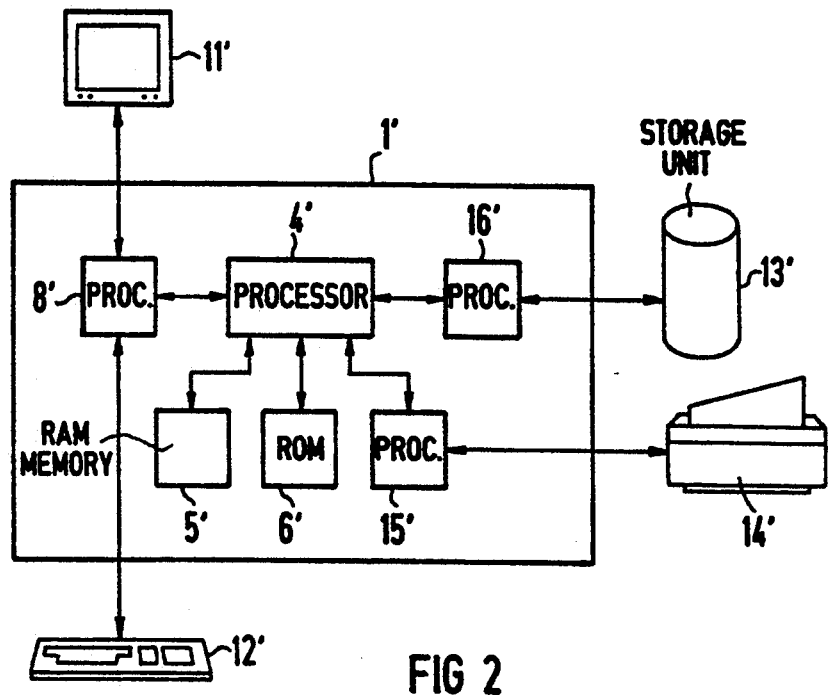
FIG. 2 illustrates a block diagram of a PC in which an embodiment of the present invention may be employed.

FIG. 2 shows the structure of a PC 1', which is similar in principle. Comparable to the programmable controller 1, the PC 1' essentially consists of a processor 4', a read-write memory 5', a read-only memory 6' for the initialization routine and the operating system, as well as a processor 8' for communicating with a keyboard 12' and a monitor 11'. Also connected up to the PC 1' are a storage unit 13', for example a disk drive, as well as a printer 14', which communicate via the processors 15', 16' with the processor 4'.

In this case as well, the read-only memory 6' is a read-only memory with electrical overwrite capability, which can be completely erased quickly by means of an electric pulse. This time, the processor 4' is, for example, an 8086 processor produced by INTEL, which after a RESET first accesses the command with the address $FFFF0_{16}$.

Figure 3:
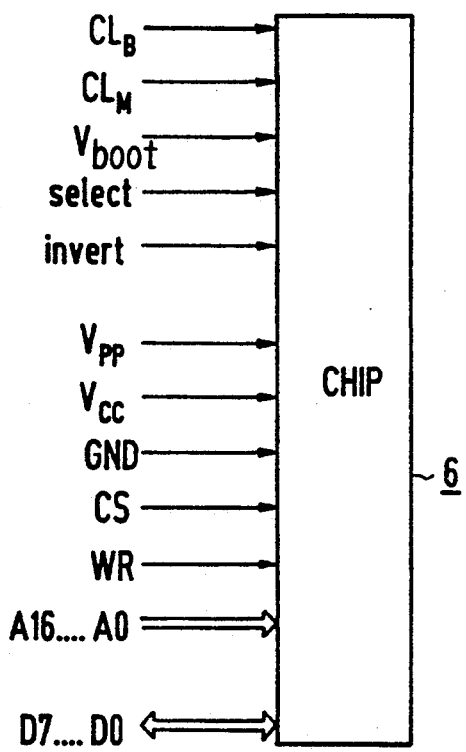
FIG. 3 illustrates a block diagram of a read-only memory.

FIG. 3 illustrates a pin configuration of the read-only-memory 6 (or 6'). According to FIG. 3, the read-only-memory 6 has the following pin connectors:

Several pin connectors D7 ... D0 for transmitting data signals;

several pin connectors A16 ... A0 for applying address signals; and pin connectors for applying control signals $V_{boot}$, select, invert, $V_{PP}$, $V_{CC}$, GND, CS, WR, $CL_B$, $CL_M$.

The control signals have the following significance.

When the signal WR exists at the same time as at least one of the programming voltages $V_{PP}$ or $V_{boot}$, data are written in the storage device 6.

Signals applied to the ROM 6 only show an effect when the chip 6 has been selected by means of a control signal CS.

The signals $V_{CC}$ and GND are used for the voltage supply and the mass frame connection.

When the invert or select signal is applied at the same time as the signals $V_{boot}$ and WR, an internal state variable S or I is written. Without the signal WR, the internal state variables S or I are only read via the pin connectors select or invert, or rather an applied signal does not effect an overwrite. The significance of the internal state variables S and I shall be explained in greater detail in conjunction with FIG. 4.

Figure 4:
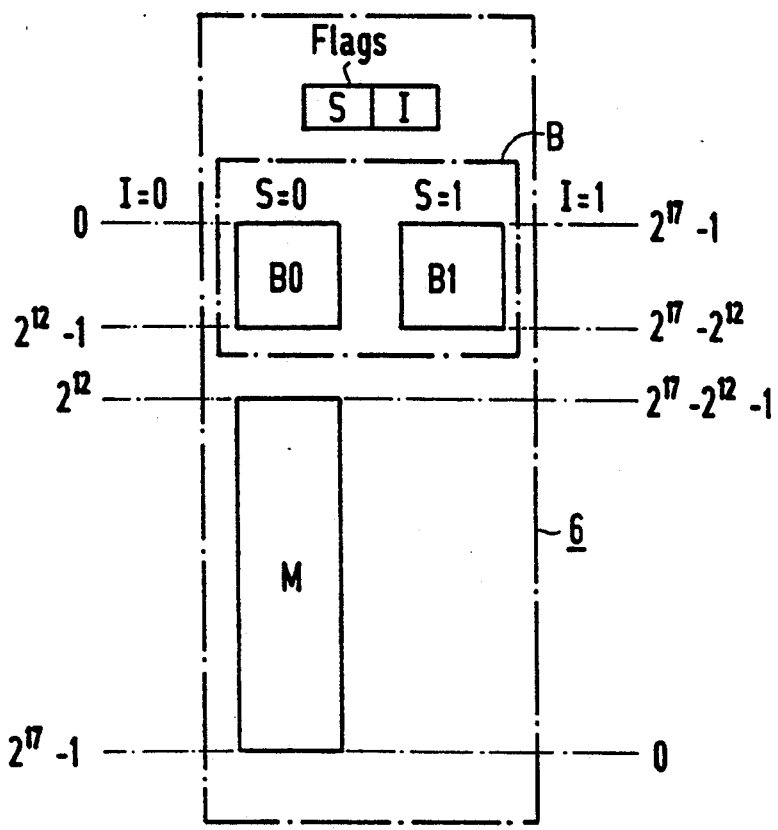
FIG. 4 illustrates the inner structure of the read-only memory in accordance with an embodiment of the present invention.

According to FIG. 4, the read-only memory 6 has two storage areas B and M, whereby the storage area B is divided into two sub-storage areas B0, B1, which reside on the same addresses.

At least the processor initialization routine, the system test routine and the initial program loader are stored in the ROM 6. Advantageously the basic inputoutput system (BIOS), as well as the entire operating system are also stored in the ROM. At least the processor initialization routine, that is the first information which the processor 4 accesses during a system initialization (reset), is stored in the storage area B0 or B1 respectively. The information can thereby be processor data, for example pointers, or commands. The system test routine and the initial program loader are also advantageously stored in the storage area B0 or B1 respectively. The system test routine and the initial program loader are stored in the storage area M to the extent that they are not already stored in the storage area B0 or B1. Furthermore, the basic input-output system (BIOS), as well as the remaining operating system are advantageously stored in the storage area M.

As is apparent from FIG. 4, the address range from 0 to $2^{12}$-1 is assigned to the storage areas B0, B1, while the address range from $2^{12}$ to $2^{17}$-1 is allocated to the storage area M. When I is set, that is I equals 1, the address signals are inverted. The reason for this is that, in case of a reset, a number of processors seek the initialization routine in the high address range, while others seek them in the low address range. When the possibility exists—as in this case by means of the internal state variable I, to ostensibly shift the storage areas B0, B1 in the address range, the read-only memory 6 can be used for both processors. Therefore, costs are saved in chip development.

To enable a proper automatic sequential starting or booting up of a system, it is not necessary for exact access of the right address. The first accessing of the read-only memory must only be in the correct range. Therefore, it even suffices when only the most significant address signals, for example the address signals A16 . . . A12 are inverted.

With the internal state variable S, one selects whether the storage area B0 or the storage area B1 is accessed when the data processing system is reset.

The storage areas M, B0, B1 and flags are produced in flash technology. This means that the storage area M can be erased by simultaneously applying the control signals $V_{PP}$ and $CL_M$, while the respectively inactive storage area B0 or B1 can be erased by simultaneously applying the control signals $V_{boot}$ and $CL_B$. For clarification of FIG. 5, it is assumed that the internal state variable S has the value 0, so that in case of a reset, the storage area B0 is accessed.

To change the initialization routine and/or the operating system, the user receives a storage medium from the manufacturer of his computer. This storage medium is usually a floppy disk on which the new version of the initialization routine or the operating system is stored. The procedure for altering the initialization routine is described in the following. However, the following statements can also be applied to altering the operating system.

When the computer is a programmable controller, the diskette is inserted in the disk drive of a programming unit 9, and the command is entered by the user to change the initialization routine. If the programming unit 9 is connected up to the central processing unit 1, the overwriting of the initialization routine is executed immediately. Otherwise, the user must program a storage module (not shown) using the programming unit 9. After the programming, this storage module is inserted in the module slot of the programmable controller 1. After inserting the storage module and requesting the change operation itself, the user, as a rule, no longer needs to be concerned with anything. The subsequent operation is carried out by the programmable controller 1, hidden from the user.

Figure 5:
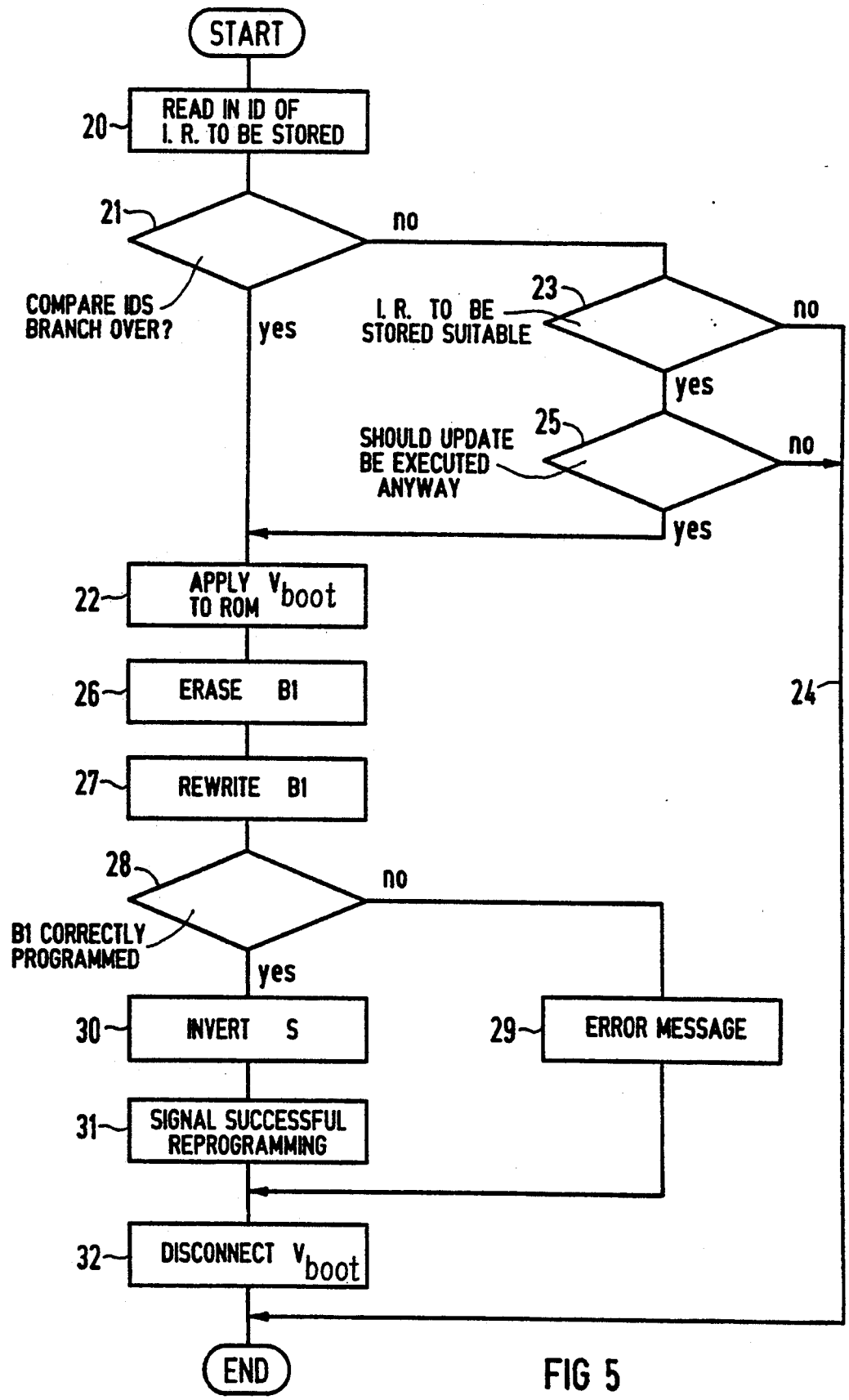
FIG. 5 illustrates a flow chart of a change operation in a ROM according to an embodiment of the present invention.

As depicted in FIG. 5, initially the identification of the currently stored initialization routine is read in the functional module 20 and compared to the identification of the initialization routine to be stored. The identification can consist, for example, of version numbers for the programmable controller 1 and the initialization routine. When the comparison of the identifications carried out by the functional module 21 reveals that the initialization routine to be stored is suited for the programmable controller 1 and that the initialization routine to be stored has a higher version number than the stored initialization routine, the branchover is made directly to the functional module 22. Otherwise, the system queries in the functional module 23, whether the initialization routine to be stored is suited for the programmable controller 1. If not, the update program is abandoned through branch 24. When the initialization routine to be stored is suited for the programmable controller 1, the version number of the initialization routine to be stored must therefore now be smaller or equal to the version number of the stored initialization routine. In this case, the functional module 25 asks the user if the update program should be executed anyway. When the user answers in the negative, the update routine is likewise abandoned through branch 24. Otherwise, the update routine is carried out.

According to FIG. 5, the update routine consists of the functional modules 22, as well as 26 through 32. In the functional module 22, the programming voltage $V_{boot}$ is initially applied to the read only memory 6. For as long as the voltage $V_{boot}$ is applied, the storage area B0 is not accessed at all, while the storage area B1 can be accessed, that is it can accessed both for purposes of reading as well as for writing, and also for erasing.

The storage area B1 is then erased and rewritten in the functional modules 26 and 27. The system then checks in the functional module 28 if the storage area B1 has been correctly programmed. If not, it branches over to the functional module 29, which outputs an error message to the user. In this case, the value of the internal state variable S is not changed.

Otherwise, the value of the internal state variable S is inverted in the functional module 30, and the inverted value is restored in the read-only memory 6. Because the value of the internal state variable S has now changed, immediately after a reset, the storage area B1 is accessed, and when the programming voltage $V_{boot}$ is applied, the storage area B0 is accessed. The successful reprogramming of the storage area B1 is also signalled via the functional module 31 to the user.

Next, the programming voltage $V_{boot}$ is again disconnected in the functional module 32. With that, the reprogramming of the storage area B1 is complete. Now automatically in case of a reset, the programs stored in the storage area B0 are no longer executed, but rather just the programs stored in the storage area B1 are executed.

If, after all, it turns out contrary to expectations that after switching over to the storage area B1, the program stored in the storage area B1 is still incorrect at this point, then the old programs that are capable of running and that are stored in the storage area B0 can be accessed again simply by changing the internal state variable S. If necessary, this change can be carried out manually, because it is not extensive.

With the exception of the functional module 25, the entire process described in connection with FIG. 5 transpires without the active participation of the user, in other words hidden from the user.

When the read-only memory 6 cannot be erased completely, i.e., the storage locations or cells must be erased and overwritten individually, another way to safeguard the computer from an uncontrollable behavior consists in

- initially altering the first command accessed during an initialization to the extent that during an initialization attempt, the next commands accessed transform the computer into a secure state, for example a system hold mode;
- the other commands and data of the initialization routine are then altered: and
- the first command is finally changed back again, so that the initialization routine can be executed again.

In conclusion, it is pointed out that the control signal which enables the storage area B1 to be programmed does not necessarily have to be a programming voltage, but can just as well be a normal control signal. In this case, it is only possible to program the storage area B1 when the programming voltage $V_{PP}$ is applied as well.

Furthermore, it is possible both to read or to write the internal state variables S, I via separate control lines, as well as to allow for these internal state variables to be accessed by applying preselected address signals while simultaneously applying the programming voltage $V_{boot}$.

What is claimed is:

1. A read-only memory having an electrical overwrite capability comprising:
   a) at least one contact adapted for connection to a line and adapted to accept address signals;
   b) at least one contact adapted for connection to a line and adapted to accept and receive data signals;
   c) at least one contact adapted for connection to a line and adapted to accept control signals;
   d) a first storage area for storing an internal state variable, said internal state variable having a first state and a second state;
   e) a second storage area including a first plurality of storage cells, each of said first plurality of storage cells having a unique address, on the basis of which individual ones of said first plurality of storage cells may be written to and read from; and
   f) a third storage area including a second plurality of storage cells, each of said second plurality of storage cells having a unique address, corresponding to the addresses of said first plurality of storage cell, on the basis of which individual ones of said second plurality of storage cells may be written to and read from, wherein when said internal state variable stored in said first storage area is at said first state, said first plurality of storage cells may be accessed only for reading and when said internal state variable stored in said first storage area is at said second state, said second plurality of storage cells may be accessed only for reading.

2. The read-only memory of claim 1, wherein said second plurality of storage cells of said third storage area can only be accessed when a special control signal is applied to said at least one contact adapted to accept control signals.

3. The read-only memory of claim 1, wherein said read-only memory further comprises a fourth storage are having a third plurality of storage cells for storing further data.

4. The read-only memory of claim 1, wherein said first storage area is adapted to further store a second internal state variable having a first state and a second state, wherein when said second internal state variable is at said first state, each bit of said address signals is inverted.

5. The read-only memory of claim 1 wherein said read-only memory is used in a computer to store at least an initialization routine.

6. The read-only memory of claim 1, wherein said at first storage area can only be accessed when special control signals are applied to said at least one contact adapted to accept control signals.

7. In a computer having a read-only memory having a first storage area storing a first initialization routine which is executed during an initialization and a second storage area storing a second initialization routine which is not executed during an initialization, a process for changing the initialization routine to be executed during an initialization comprising the steps of:
   a) applying a first control signal to the read-only memory for enabling said second initialization routine stored in said second storage area to be overwritten;
   b) erasing said second initialization routine;
   c) rewriting a new initialization routine in said second storage area;
   d) changing the state of a second control signal so that during an initialization, said new initialization routine in said second storage area will be executed rather than said first initialization routine stored in said first storage area; and
   e) resetting said first control signal.

8. The process according to claim 7 wherein said new initialization routine is transmitted block-by-block to the computer and the contents of the read-only memory are overwritten when a change request is transmitted to the computer.

9. The process of claim 7 further comprising the steps of:
   a') determining whether said new initialization routine is suitable for the computer; and
   a'') only performing steps (a) through (e) if said new initialization routine is determined to be suitable for the computer in step (a').

10. The process according to claim 9, wherein said step of determining comprises the substeps of:
   i) storing at least one identification code in each initialization routine; and
   ii) comparing the identification code of the new initialization routine with predetermined identification codes indicative of suitable initialization routines before said new initialization routine is written over said first initialization routine.

* * * * *